United States Patent
Zhang et al.

(10) Patent No.: US 11,810,950 B2
(45) Date of Patent: Nov. 7, 2023

(54) SEMICONDUCTOR STRUCTURE

(71) Applicants: Semiconductor Manufacturing International (Shanghai) Corporation, Shanghai (CN); Semiconductor Manufacturing International (Beijing) Corporation, Beijing (CN)

(72) Inventors: Huan Yun Zhang, Shanghai (CN); Jian Wu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/447,673

(22) Filed: Sep. 14, 2021

(65) Prior Publication Data
US 2021/0408236 A1    Dec. 30, 2021

Related U.S. Application Data

(62) Division of application No. 16/419,830, filed on May 22, 2019, now Pat. No. 11,164,941.

(30) Foreign Application Priority Data

Jun. 5, 2018    (CN) .......................... 201810567937.5

(51) Int. Cl.
*H01L 29/06*    (2006.01)
*H01L 29/423*    (2006.01)
(Continued)

(52) U.S. Cl.
CPC ...... *H01L 29/0673* (2013.01); *H01L 21/0217* (2013.01); *H01L 21/02236* (2013.01); *H01L 21/02532* (2013.01); *H01L 21/308* (2013.01); *H01L 21/823412* (2013.01); *H01L 21/823418* (2013.01); *H01L 21/823431* (2013.01); *H01L 27/0886* (2013.01); *H01L 29/0847* (2013.01); *H01L 29/1033* (2013.01); *H01L 29/42392* (2013.01); *H01L 29/6656* (2013.01); *H01L 29/66545* (2013.01); *H01L 29/7843* (2013.01); *H01L 29/6659* (2013.01)

(58) Field of Classification Search
None
See application file for complete search history.

(56) References Cited

U.S. PATENT DOCUMENTS 9,111,784 B2    8/2015    Ching et al.
10,720,503 B2    7/2020    Ching et al.
(Continued)

FOREIGN PATENT DOCUMENTS

CN    107799516 A    3/2018

*Primary Examiner* — Long Pham
(74) *Attorney, Agent, or Firm* — Anova Law Group, PLLC

(57) ABSTRACT

A semiconductor structure is provided. The semiconductor structure includes a semiconductor substrate having a first region and a second region; first nanowires formed over the first region of the semiconductor substrate; second nanowires with a diameter smaller than a diameter of the first nanowires formed over the second region of the semiconductor substrate; a first gate layer formed around the first nanowires; and a second gate layer formed around the second nanowires.

10 Claims, 8 Drawing Sheets

(51) Int. Cl.
*H01L 29/78* (2006.01)
*H01L 21/02* (2006.01)
*H01L 21/308* (2006.01)
*H01L 29/66* (2006.01)
*H01L 21/8234* (2006.01)
*H01L 29/10* (2006.01)
*H01L 29/08* (2006.01)
*H01L 27/088* (2006.01)

(56) References Cited

U.S. PATENT DOCUMENTS

| | | |
|---|---|---|
| 2011/0133169 A1 | 6/2011 | Bangsaruntip et al. |
| 2015/0053912 A1 | 2/2015 | Ching et al. |
| 2016/0056236 A1 | 2/2016 | Ching et al. |
| 2016/0225850 A1* | 8/2016 | Chen .................... H01L 29/775 |
| 2017/0154973 A1 | 6/2017 | Ching et al. |
| 2019/0371888 A1 | 12/2019 | Zhang et al. |

\* cited by examiner ial application of U.S. patent
SEMICONDUCTOR STRUCTURE

CROSS-REFERENCES TO RELATED APPLICATIONS

This application is a divisional application of U.S. patent application Ser. No. 16/419,830, filed on May 22, 2019, which claims the priority of Chinese patent application No. 201810567937.5, filed on Jun. 5, 2018, the entirety of which is incorporated herein by reference.

FIELD OF THE DISCLOSURE

The present disclosure generally relates to the field of semiconductor manufacturing and, more particularly, relates to semiconductor structures and fabrication methods.

BACKGROUND

With the continuous increase of the device density and integration level of semiconductor devices, the size of the gate of transistor has become smaller and smaller. The reduction of the size of the gate of the transistor causes the transistor to have a short channel effect. Accordingly, the leakage current is generated; and, ultimately, the electrical properties of the semiconductor devices are adversely affected.

To overcome the short channel effect and reduce the leakage current, three-dimensional transistor technology has been developed. For example, nanowire field-effect transistors (nanowire FETs) have been developed. The nanowire FETs are able to overcome the short channel effect and reduce the leakage current while reducing the critical dimension of the transistors.

However, it is desirable to improve the performance of the nanowire FETs. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a semiconductor substrate having a first region and a second region; forming first nanowires over the first region of the semiconductor substrate; forming second nanowires with a diameter smaller than a diameter of the first nanowires over of the second region of the semiconductor substrate; forming a first gate layer around the first nanowires; and forming a second gate layer around the second nanowires.

Another aspect of the present disclosure includes a semiconductor structure. The semiconductor structure includes a semiconductor substrate having a first region and a second region; first nanowires formed over the first region of the semiconductor substrate; second nanowires with a diameter smaller than a diameter of the first nanowires formed over the second region of the semiconductor substrate; a first gate layer formed around the first nanowires; and a second gate layer formed around the second nanowires.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
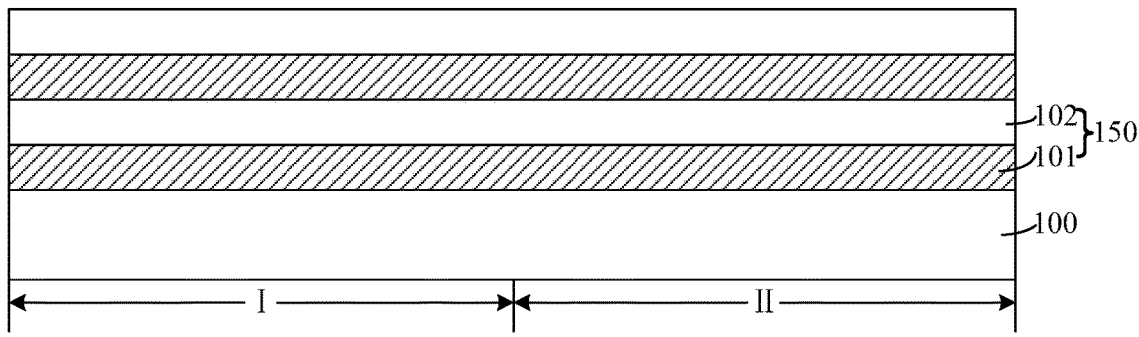
FIGS. 1-3 illustrate structures corresponding to certain stages during a fabrication process of a semiconductor structure.
Figure 2:
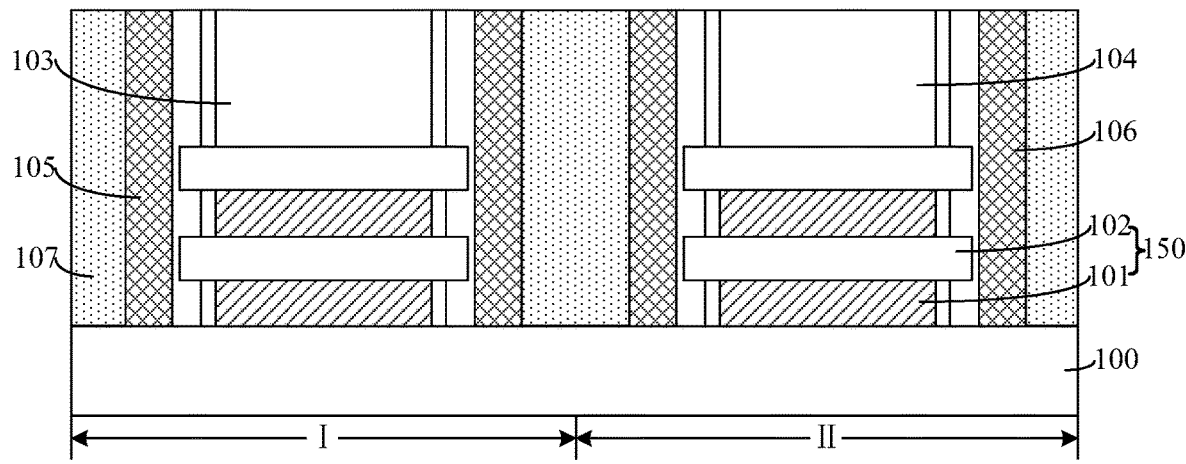
Figure 3:
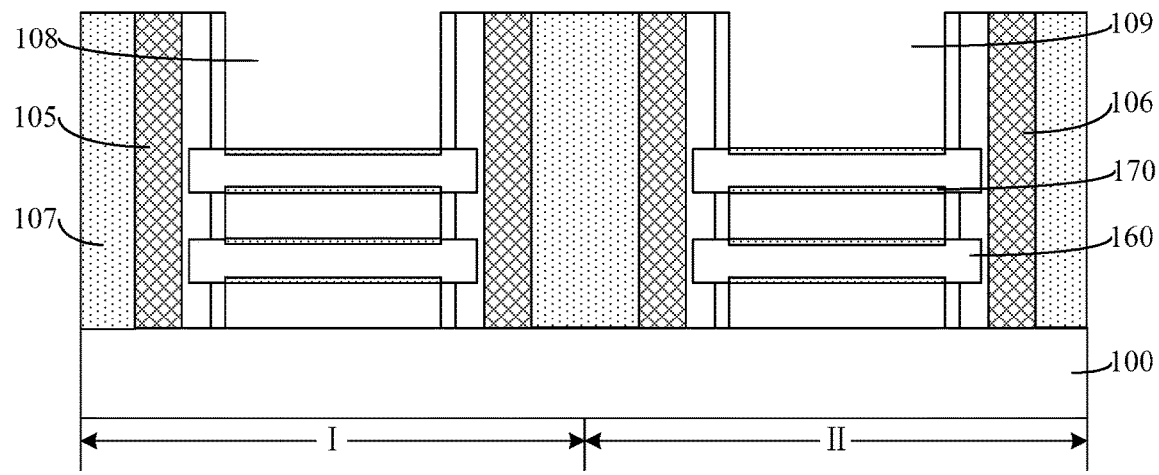

FIGS. 1-3 illustrate structures corresponding to certain stages during a fabrication process of a semiconductor structure As shown in FIG. 1, the fabrication process includes providing a semiconductor substrate 100. The semiconductor substrate 100 includes a first region I and a second region II. A fin material layer extending from the first region I to the second region II is formed on the surface of the semiconductor substrate 100. The fin material layer includes a plurality of multiple-layer stacked fin units 150. Each fin unit includes a sacrificial layer 101 and a nanowire material layer 102 on the sacrificial layer 101. A mask layer (not shown) is formed on the fin material layer. The mask layer exposes portions of the top surface of the fin material layer in the first region I and the second region II.

Further, as shown in FIG. 2, the fin material layer is etched using the mask layer as an etching mask until the top surface of the semiconductor substrate 100 is exposed to form a first fin (not labeled) on the first region I of the semiconductor substrate 100 and a second fin (not labeled) on the second region II of the semiconductor substrate 100. Then, a first dummy gate structure 103 is formed across the first fin and a second dummy gate structure 104 is formed across the second fin. Further, first doped source/drain regions 105 are formed in the first fin at both sides of the first dummy gate structure 103, and second doped source/drain regions 106 are formed in the second fin at both sides of the second dummy gate structure 104. Further, a dielectric layer 107 is formed on the portions of the surface of the semiconductor substrate 100 and the sidewall surfaces of the first doped source/drain regions 105 and the second doped source/drain regions 106. The dielectric layer 107 exposes the top surfaces of the first dummy gate structure 103 and the second dummy gate structure 104.

Further, as shown in FIG. 3, the first dummy gate structure 103 is removed to form a first dummy gate opening 108 in the dielectric layer 107 in the first region I; and the second dummy gate structure 104 is removed to form a second dummy gate opening 109 in the dielectric layer 107 in the second region II. Then, the portion of the sacrificial layer 101 exposed by the first dummy gate opening 108 is removed; and the portion of the sacrificial layer 101 exposed by the second dummy gate opening 109 is removed. After removing the portions of the sacrificial layer 101 in the first region I and the second region II, the portions of the nanowire material layer 102 in the first region I and the second region II are oxidized to form the nanowires 160 and the oxide layer 170 around the nanowires 160.

The nanowire material layer 102 is often made of silicon; and is often formed by an epitaxial growth process. The thickness difference between the portion of the nanowire material layer 102 in the first region I and the portion of the nanowire material layer 102 in the second region II is substantially small. Further, the portion of the nanowire material layer 102 in the first region I and the portion of the nanowire material layer 102 in the second region II are subsequently oxidized simultaneously. Thus, the consumption amount of the nanowire material layer 102 in the first region I and the consumption amount of the nanowire material layer 102 in the second region II are substantially the same. Thus, the diameter of the nanowires 160 in first region I is the same as the diameter of the nanowires 160 in the second region II.

The nanowires 160 in the first region I are used as nanowires of core devices. The nanowires 160 in the second region II are used as nanowires of peripheral devices. Because the device voltage of the core devices is substantially small, the major focus of the core devices is the body effect. To reduce the body effect of the core devices, the diameter of the nanowires 160 is substantially small to facilitate a complete depletion of the depletion layers. However, if the diameter of the nanowires 160 is substantially small, the voltage of the devices in the peripheral region is substantially large, it is easy for the devices in the peripheral region to accumulate heat. In particular, the self-heating effect of the devices in the peripheral region is substantially severe; and the performance of the devices in the peripheral region is not as desired.

The present disclosure provides a semiconductor structure and a method for forming a semiconductor structure. In the fabrication method, first nanowires may be formed over the surface of the semiconductor substrate in the first region, and second nanowires may be formed over the surface of the semiconductor substrate in the second region. The diameter of the first nanowires may be greater than the diameter of the second nanowires. The fabrication method may be able to improve the performance of the devices the first region and the devices in the second region simultaneously.

Figure 19:
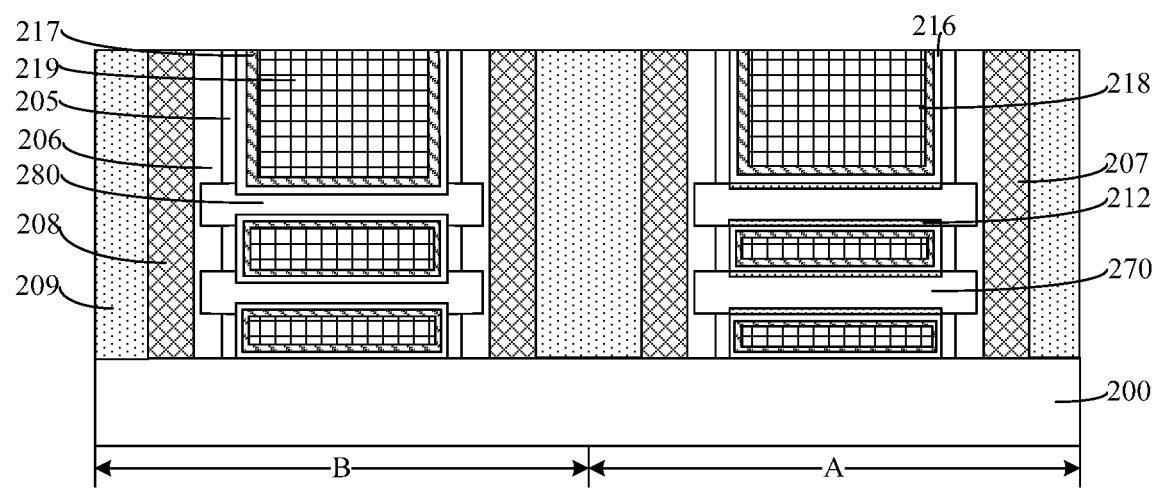
Figure 20:
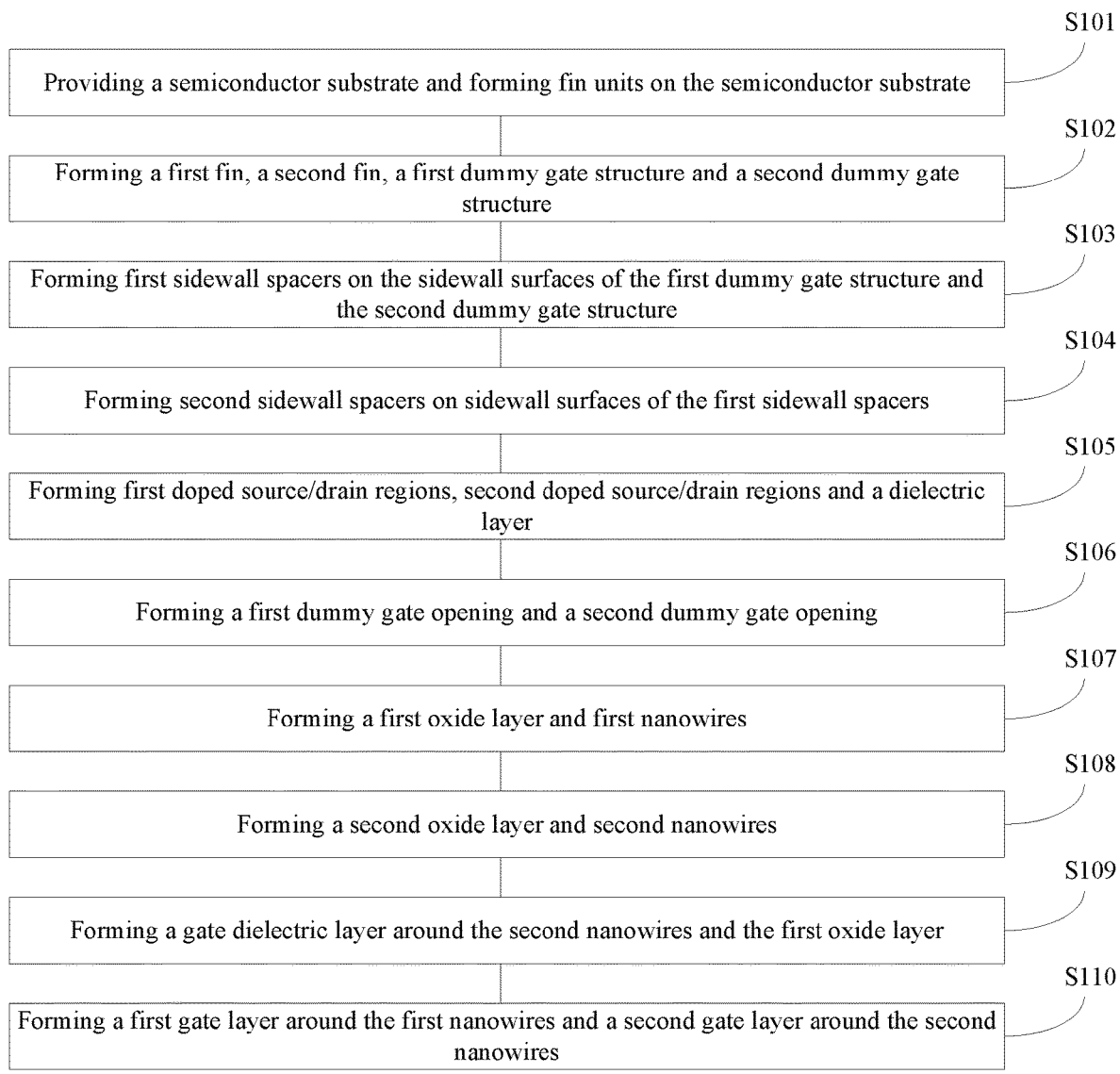
FIG. 20 illustrates an exemplary fabrication process of a semiconductor structure consistent with various disclosed embodiments.

FIG. 20 illustrates an exemplary fabrication process of a semiconductor structure consistent with various disclosed embodiments. FIGS. 4-19 illustrate structures corresponding to certain stages during an exemplary fabrication process of a semiconductor structure consistent with various disclosed embodiments.

Figure 4:
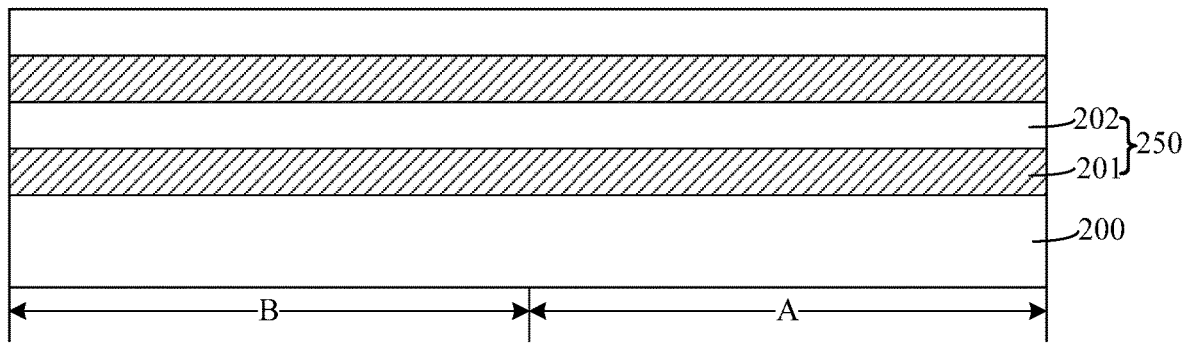
FIGS. 4-19 illustrate structures corresponding to certain stages during an exemplary fabrication process of a semiconductor structure consistent with various disclosed embodiments.

As shown in FIG. 20, at the beginning of the fabrication process, a semiconductor substrate with certain structures is provided (S101). FIG. 4 illustrates a corresponding semiconductor structure.

As shown in FIG. 4, a semiconductor substrate 200 is provided. The semiconductor substrate 200 may include a first region A and a second region B. A fin material layer (not labeled) may be formed on a surface of the semiconductor substrate 200. The fin material layer may include a plurality of multiple-layer stacked fin units 250. Each fin unit 250 may include a sacrificial layer 201 and a nanowire material layer 202 on the sacrificial layer 201. The sacrificial layers 201 and the nanowire material layers 202 may be made of different materials. A first mask layer (not shown) may be formed on portions of the fin material layer in the first region A and portions of the fin material layer in the second region B.

In one embodiment, the semiconductor substrate 200 is made of silicon. In some embodiments, the semiconductor substrate may be a germanium substrate, a silicon germanium substrate, a silicon on insulator (SOI) substrate, a germanium on insulator (GOI) substrate, or a silicon germanium on insulator substrate, etc.

The sacrificial layers 201 and the nanowire material layers 202 may be made of different materials. Thus, the sacrificial layers 201 and the nanowire material layers 202 may have different etching selectivity ratios. When subsequently removing the sacrificial layers 201, the damages to the nanowire material layers 202 may be substantially small.

The sacrificial layers 201 and the nanowire material layers 202 may be made of any appropriate material. In one embodiment, the sacrificial layers 201 are made of silicon germanium; and the nanowire material layers 202 are made of silicon.

The thickness of the nanowire material layers 202 may be in a range of approximately 7 nm-10 nm. The portions of the nanowire material layers 202 in the first region A may be used to subsequently form first nanowires. The portions of the nanowire material layers 202 in the second region B may be used to subsequently form second nanowires. The nanowires may be used to subsequently form gate-all-around (GAA) transistors.

The first region A may be used to form peripheral devices (IO devices). The second region B may be used to form core devices. The voltage applied on the core devices may be in a range of approximately 0.6 V-1.0 V. The voltage applied on the peripheral devices may be in a range of approximately 1.6 V-2.0 V.

The first mask layer may be made of any appropriate material. In one embodiment, the first mask layer is made of silicon nitride, or titanium nitride, etc. The first mask layer may be used as a mask for subsequently forming a first fin and a second fin.

Figure 5:
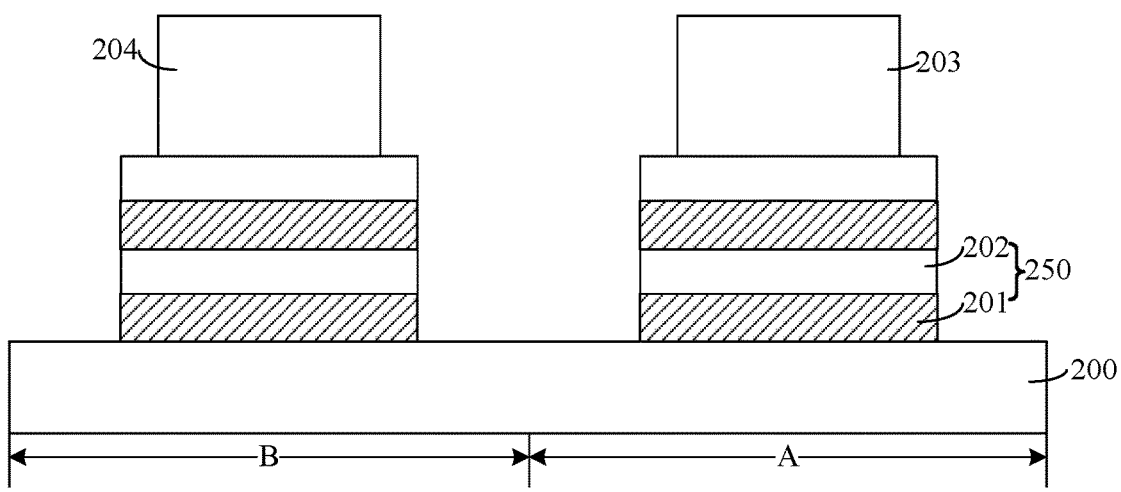

Returning to FIG. 20, after forming the first mask layer, a first fin, a second fin, a first dummy gate structure and a second dummy gate structure may be formed (S102). FIG. 5 illustrates a corresponding semiconductor structure.

As shown in FIG. 5, a first fin (not labeled) is formed on the surface of the semiconductor substrate 200 in the first region A, and a second fin (not labeled) is formed on the surface of the semiconductor substrate 200 in the second region B. Further, a first dummy gate structure 203 may be formed across the first fin in the first region A, and a second dummy gate structure 204 may be formed across the second fin in the second region B.

The first fin and the second fin may be formed by etching the fin material layer using the first mask layer an etching mask until the top surface of the semiconductor substrate 200 is exposed. The process for etching the fin material layer using the first mask layer as an etching mask may include a dry etching process, a wet etching process, or a combination of a dry etching process and a wet etching process.

In one embodiment, the first dummy gate structure 203 and the second dummy gate structure 204 may be formed simultaneously. The process for forming the first dummy gate structure 203 and the second dummy gate structure 204 may include forming a dummy gate dielectric layer on the sidewall surfaces and the top surface of the first fin, the sidewall surfaces and the top surface of the second fin, and the top surface of the of the semiconductor substrate 200; forming a dummy gate layer on the dummy gate dielectric layer; and forming a second mask layer (not shown) on the dummy gate layer. The second mask layer may expose a portion of the top surface of the dummy gate layer in the first region A and a portion of the top surface of the dummy gate layer in the second region B. After forming the second mask layer, the dummy gate dielectric layer and the dummy gate layer may be etched using the second mask layer as an etching mask until the top surface of the semiconductor substrate 200 is exposed to form the first dummy gate structure 203 across the first fin and the second dummy gate structure 204 across the second fin.

The dummy gate dielectric layer may be made of any appropriate material, such as silicon oxide, etc. Various processes may be used to form the dummy gate dielectric layer such as a chemical vapor deposition (CVD) process, or a physical vapor deposition (PVD) process, etc.

The dummy gate layer may be made of any appropriate material, such as silicon, etc. Various processes may be used to form the dummy gate layer, such as a CVD process, or a PVD process, etc.

The second mask layer may be made of any appropriate material, such as silicon nitride, or titanium nitride, etc. The second mask layer may be used as the mask for forming the first dummy gate structure 203 and the second dummy gate structure 204.

The process for etching the dummy gate dielectric layer and the dummy gate layer using the second mask layer as an etching mask may be a dry etching process, a wet etching process, or a combination of a dry etching process and a wet etching process.

Figure 6:
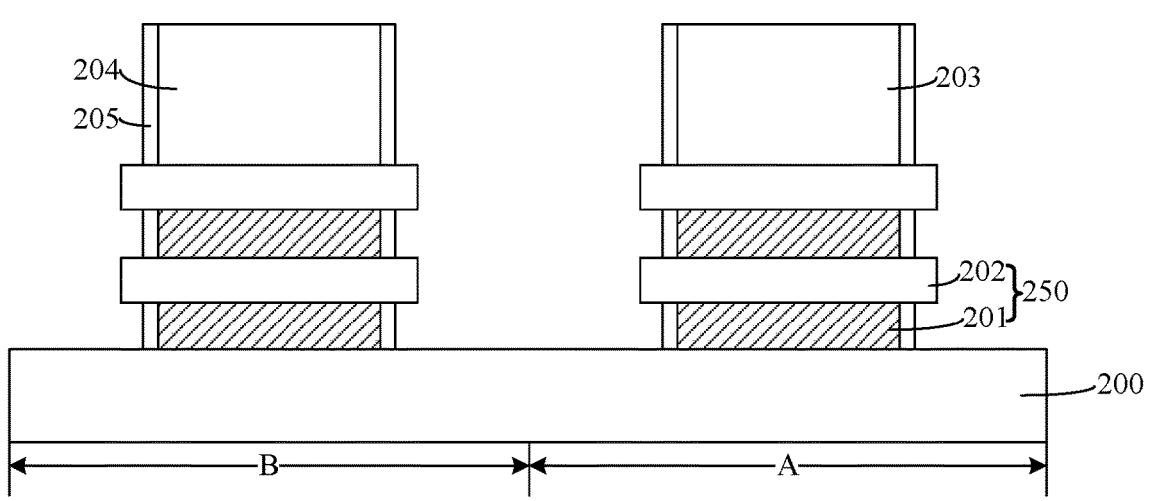

Returning to FIG. 20, after forming the first dummy gate structure and the second dummy gate structure, first sidewall spacers may be formed (S103). FIG. 6 illustrates a corresponding semiconductor structure.

As shown in FIG. 6, after forming the first dummy gate structure 203 and the second dummy gate structure 204, portions of the sacrificial layers 201 may be removed to cause the sacrificial layers 201 to concave relative to the sidewall surfaces of the nanowire material layers 202. Then, first sidewall spacers 205 may be formed on the sidewall surfaces of the first dummy gate structure 203 and the second dummy gate structure 204.

Removing the portions of the sacrificial layers 201 to cause the sacrificial layers 201 to concave relative to the sidewall surfaces of the nanowire material layers 202 may facilitate to subsequently form lightly-doped regions.

The portions of the sacrificial layers 201 may be removed by any appropriate process. In one embodiment, a wet etching process is used to remove the portions of the sacrificial layers 201.

The first sidewall spacers 205 may be made of any appropriate material, such as silicon oxide, or silicon nitride, etc. The first sidewall spacers 205 may be used to define the positions of the subsequently formed lightly doped regions.

After forming the first sidewall spacers 205, lightly doped regions (not shown) may be formed. The lightly doped regions may be formed in the first fin at both sides of the first dummy gate structure 203 and the first sidewall spacers 205 and in the second fin at both sides of the second dummy gate structure 204 and the first sidewall spacers 205.

The lightly doped regions may be formed by any appropriate process. In one embodiment, an ion implantation process is used to form the lightly doped regions. The ion implantation process may implant lightly doping ions into the first fin and the second fin to form the lightly doped regions. The conductive type of the lightly doping ions may be related to the type of the transistors in the semiconductor structure. When the transistors are NMOS transistors, the lightly doping ions may be N-type ions, such as P ions, or As ions, etc. When the transistors are PMOS transistors, the lightly doped ions may be P type ions, such as B ions, etc.

Figure 7:
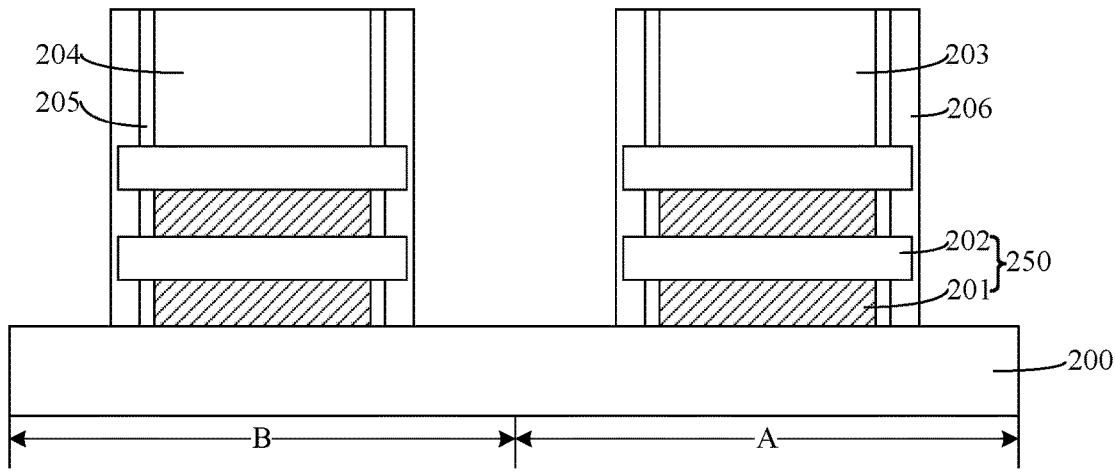

Returning to FIG. 20, after forming the first sidewall spacers and the lightly doped regions, second sidewall spacers may be formed on the sidewall surfaces of the first sidewall spacers (S104). FIG. 7 illustrates a corresponding semiconductor structure.

As shown in FIG. 7, after forming the lightly doped regions, second sidewall spacers 206 may be formed on the first sidewall spacers 205. The method for forming the second sidewall spacers 206 may include forming a second sidewall spacer material layer on the semiconductor substrate 200, the top surfaces of the first dummy gate structure 203 and the second dummy gate structure 204 and the sidewall surfaces of the first sidewall spacers 205; and removing portions of the second sidewall spacer material layer on the semiconductor substrate 200, and the top surfaces of the first dummy gate structure 203 and the second dummy gate structure 204.

The second sidewall spacer material layer may be made of any appropriate material, such as silicon nitride, etc. Various processes may be used to form the second sidewall spacer material layer, such as a CVD process, or a PVD process, etc.

The portions of the second sidewall spacer material layer on the semiconductor substrate 200, and the top surfaces of the first dummy gate structure 203 and the second dummy gate structure 204 may be removed by a dry etching process.

The second sidewall spacers 206 in the first region A may be used to define the positions of the subsequently formed first doped source/drain regions. The second sidewall spacers 206 in the second region B may be used to define the positions of the subsequently formed second doped source/drain regions.

Figure 8:
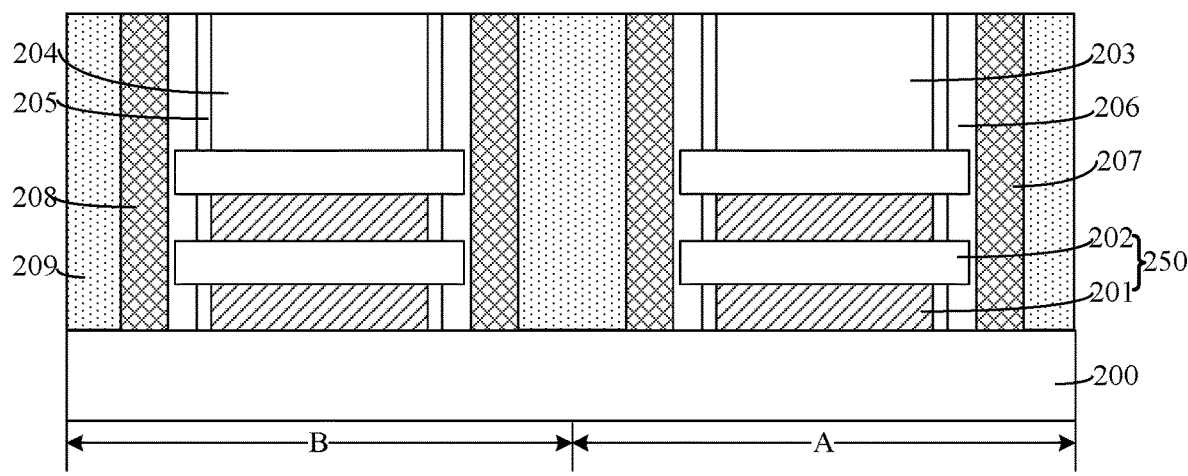

Returning to FIG. 20, after forming the second sidewall spacers, first doped source/drain regions, second doped source/drain regions and a dielectric layer may be formed (S105). FIG. 8 illustrates a corresponding semiconductor structure.

As shown in FIG. 8, first doped source/drain regions 207 are formed in the first fin at both sides of the first sidewall spacers 205 and the second sidewall spacers 206; and second doped source/drain regions 208 are formed in the second fin at both sides of the first sidewall spacers 205 and the second sidewall spacers 206. Further, a dielectric layer 209 may be formed on the surface of the semiconductor substrate 200 and on the sidewall surfaces of the first doped source/drain regions 207 and the second doped source/drain regions 208. The dielectric layer 209 may expose the top surfaces of the first dummy gate structure 203 and the second dummy gate structure 204.

The process for forming the first doped source/drain regions 207 may include forming first source/drain openings in the first fin at both sides of the first sidewall spacers 205 and the second sidewall spacers 206; forming a first epitaxial layer in the first source/drain openings; and doping first source/drain ions in the first epitaxial layer to form the first doped source/drain regions 207.

Various processes may be used to form the first source/drain openings. In one embodiment, the first source/drain openings are formed by a dry etching process and a wet etching process.

The first epitaxial layer and the first source/drain doping ions may be related to the transistor of the semiconductor structure. In one embodiment, the transistor is a PMOS transistor. Thus, the first epitaxial layer may be made of Si or Ge, etc. The first source/drain doping ions may be P-type ions, such as B ions, etc.

In some embodiments, the transistor may be an NMOS transistor. Thus, the first epitaxial layer may be made of silicon carbide, or Si, etc. The first source/drain doping ions may be N-type ions, such as P ions, or As ions, etc.

The process for forming the second doped source/drain regions 208 may be the same as the process for forming the first doped source/drain regions 207. In some embodiments, the second doped source/drain regions may also be formed by other appropriate processes.

The process for forming the dielectric layer 209 may include forming a dielectric material layer on the semiconductor substrate 200, the surfaces of the first doped source/drain regions 207 and the second doped source/drain regions, the sidewall surfaces and the top surfaces of the first dummy gate structure 203 and the sidewall surfaces and the top surfaces of the second dummy gate structure 204; and removing portions of the dielectric material layer on the top surfaces of the first dummy gate structure 203 and the second dummy gate structure 204. The dielectric layer 209 may achieve electrical isolations of semiconductor devices.

The dielectric material layer may be made of any appropriate material, such as silicon oxide or silicon oxynitride, etc. Various processes may be used to form the dielectric material layer, such as a CVD process, or a PVD process, etc.

Various processes may be used to remove portions of the dielectric material layer on the top surfaces of the first dummy gate structure 203 and the second dummy gate structure 204, such as a chemical mechanical polishing (CMP) process, etc.

Figure 9:
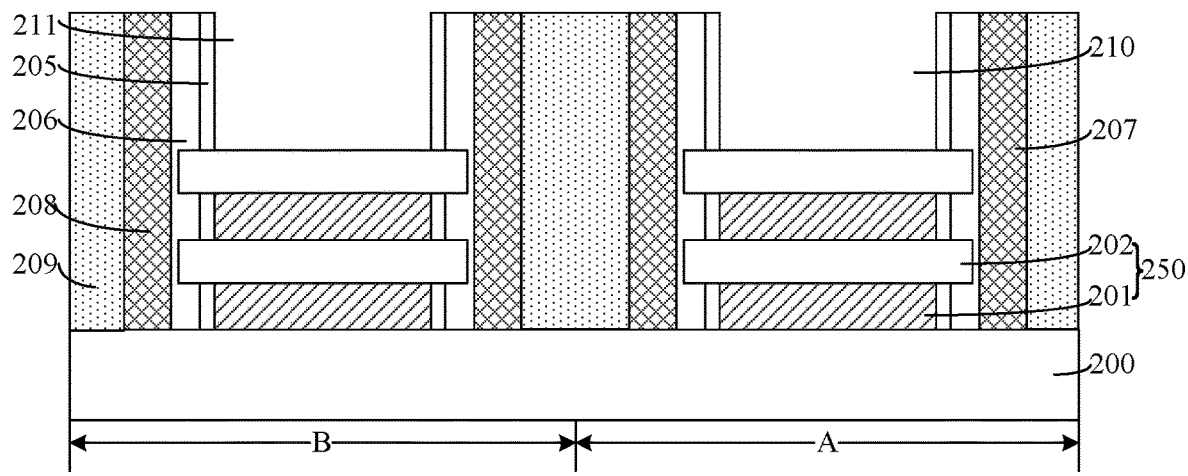

Returning to FIG. 20, after forming the dielectric layer, a first dummy gate opening and a second dummy gate opening may be formed (S106). FIG. 9 illustrates a corresponding semiconductor structure.

As shown in FIG. 9, the first dummy gate structure 203 may be removed to form a first dummy gate opening 210 in the dielectric layer 209 in the first region A. The second dummy gate structure 204 may be removed to form a second dummy gate opening 211 in the dielectric layer in the second region B. The first dummy gate opening 210 may be used to host the subsequently formed first gate layer. The second dummy gate opening 211 may be used to host the subsequently formed second gate layer.

The process for removing the first dummy gate structure 203 may include removing the dummy gate layer. Then, the dummy gate dielectric layer may be removed.

The dummy gate layer may be removed by a dry etching process, a wet etching process, or a combination of a dry etching process and a wet etching process. The dummy gate dielectric layer may be removed by a dry etching process, a wet etching process, or a combination of a dry etching process and a wet etching process.

The process for removing the second dummy gate structure 204 may be the same as the process for removing the first dummy gate structure 203. In some embodiments, other appropriate process may used to remove the second dummy gate structure 204.

Figure 10:
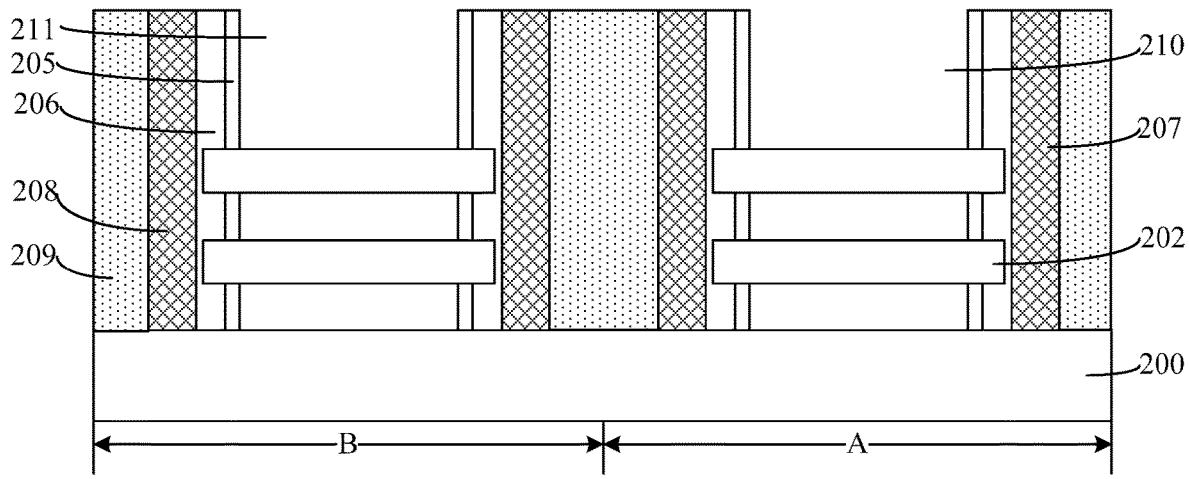

After forming the first dummy gate opening 210 and the second dummy gate opening 211, as shown in FIG. 10, the sacrificial layers 201 exposed by the first dummy gate opening 210 and the second dummy gate opening 211 may be removed. After the exposed sacrificial layers 201 are removed, the nanowire material layer 202 in the first region A and the second region B may be suspended.

Various processes may be used to remove the sacrificial layers 201 exposed by the first dummy gate opening 210 and the second dummy gate opening 211. In one embodiment, a wet etching process is used to remove the sacrificial layers 201 exposed by the first dummy gate opening 210 and the second dummy gate opening 211. The wet etching process may use an etching solution to etch the sacrificial layers 201.

Because the nanowire material layers 202 and the sacrificial layers 201 may be made of different materials, the etching solution may have an etching selectivity to the nanowire material layers 202 and the sacrificial layers 201. The etching solution may be used to remove the sacrificial layers 201, and the etching solution may have a substantially low etching rate to the nanowire material layers 202. Thus, the damage to the nanowire material layers 202 may be substantially small.

Figure 11:
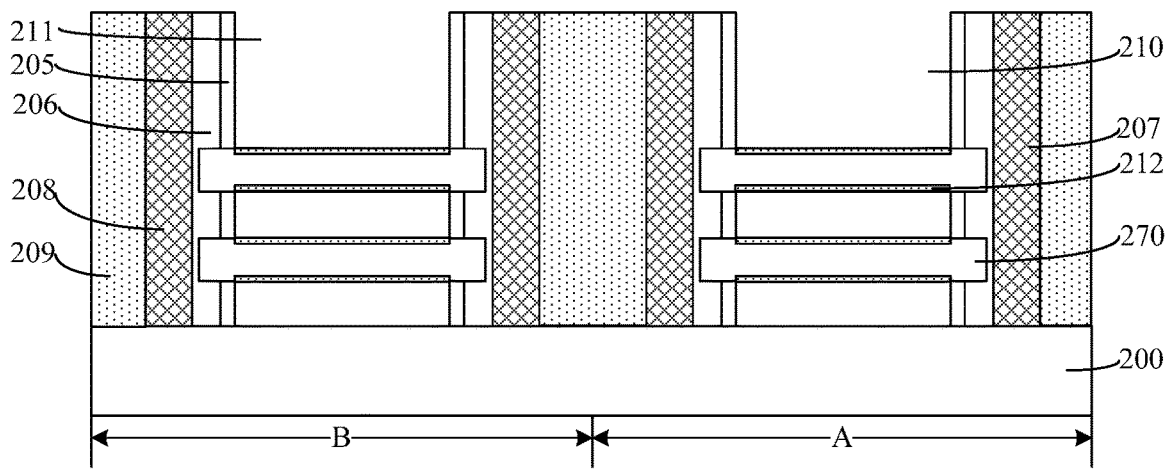

Returning to FIG. 20, after removing the portions of the sacrificial layers, a first oxide layer may be formed (S107). FIG. 11 illustrates a corresponding semiconductor structure.

As shown in FIG. 11, the portions of the nanowire material layers 202 in the first region A and the second region B may be oxidized to form a first oxide layer 212 around the portions of the nanowire material layers 202 in the first region A and the second region B. In one embodiment, the remaining nanowire material layers 202 may be configured as first nanowires 270. In particular, the first oxide layer 212 may be formed around the first nanowires 270.

The first oxide layer 212 may be made of silicon oxide. The process for forming the first oxide layer 212 may be a thermal oxidation process. The diameter of the first nanowires 270 may be in a range of approximately 5.5 nm-8 nm.

The first nanowires 270 in the first region A may be used as the nanowires of the GAA transistors in the first region A. The first region A may be used to form peripheral devices. Because the area occupied by the peripheral devices may be substantially small, the body effect of the peripheral devices may be substantially small. Thus, the main focus of the peripheral devices may be the self-heating effect. When the diameter of the first nanowires 270 is substantially large, it may not be easy for the first nanowires 270 to accumulate heat. Thus, the self-heating effect of the peripheral devices may be reduced.

Figure 12:
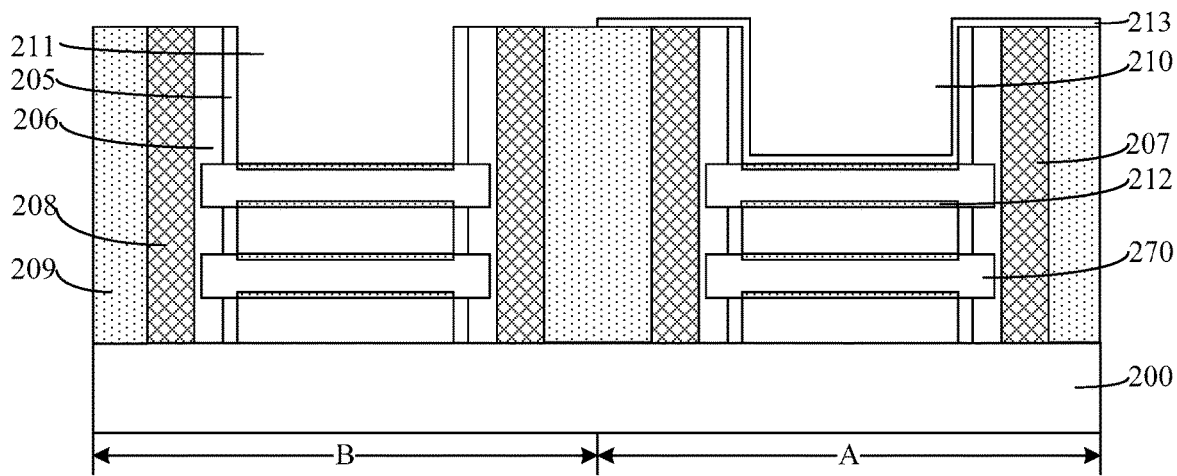

Further, as shown in FIG. 12, after forming the first oxide layer 212, a protective layer 213 may be formed on the first oxide layer 212 in the first region A. The protective layer 213 may be used to protect the first oxide layer 213 in the first region A.

The process for forming the protective layer 213 may include forming a protective material layer on the first oxide layer 212 in both the first region A and the second region B; and removing the protective material layer in the second region B.

The protective material layer may be made of any appropriate material, such as silicon nitride, etc. Various processes may be used to form the protective material layer, such as a CVD process, or a PVD process, etc.

The process for removing the protective material layer in the second region B may be a dry etching process, a wet etching process, or a combination of a dry etching process and a wet etching process, etc.

Figure 13:
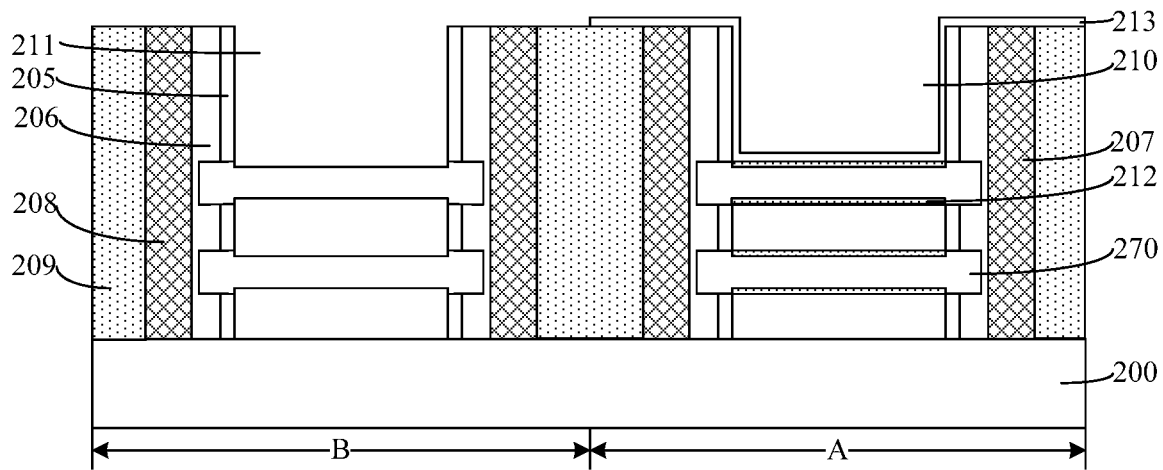

Further, as shown in FIG. 13, after forming the protective layer 213, the first oxide layer 212 in the second region B may be removed. The first oxide layer 212 in the second region B may be removed by any appropriate process, such as a dry etching process, a wet etching process, or a combination of a dry etching process and a wet etching process, etc.

After removing the first oxide layer 212 in the second region B, the first nanowires 270 in the second region B may be exposed. A subsequent oxidization process may be used to oxidize the first nanowires in the second region B to form second nanowires in the second region B.

Figure 14:
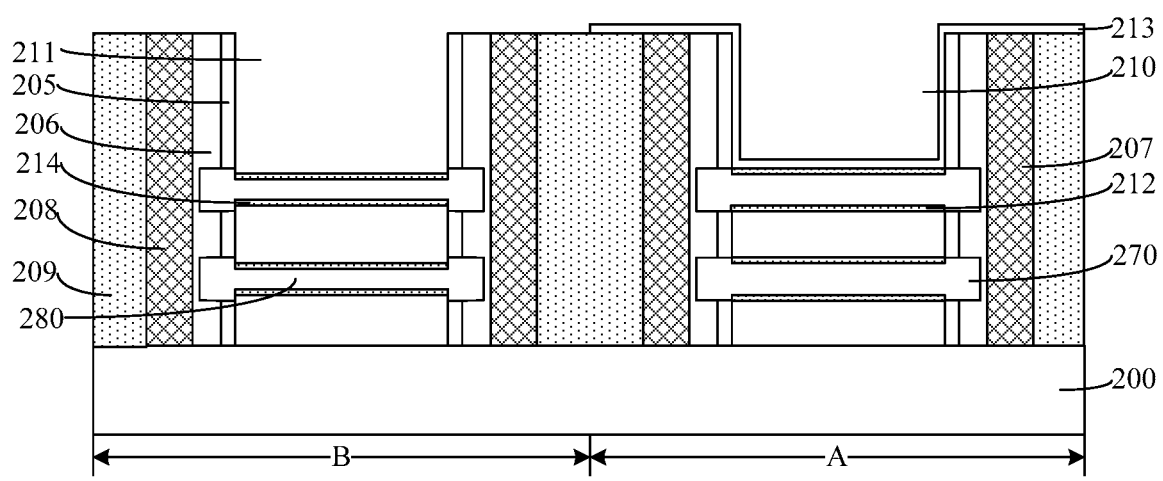

Returning to FIG. 20, after removing the first oxide layer in the second region, a second oxide layer and second nanowires may be formed (S108). FIG. 14 illustrates a corresponding semiconductor structure.

As shown in FIG. 14, second nanowires 280 may be formed in the second region B; and a second oxide layer 214 may be formed around the second nanowires 280. The second nanowires 280 and the second oxide layer 214 may be formed by oxidizing portions of the first nanowires 270 in the second region B. The second oxide layer 214 may be made of silicon oxide.

The portions of the first nanowires 270 in the second region B may be oxidized by a thermal oxidation process to form the second nanowires 280. The diameter of the second nanowires 280 may be in a range of approximately 4.5 nm-7 nm.

The second nanowires 280 may be used to as the nanowires of the GAA transistors in the second region B. The second region B may be used to form the core devices. The voltage of the core devices may be substantially small. Thus, the heat generated by the core devices may not be easy to accumulate. Accordingly, the self-heating effect the core devices may not be obvious; and the main focus of the core devices may be the body effect. Because the diameter of the second nanowires 280 may be substantially small, the depletion region may be completely depleted. Thus, the body effect of the core devices may be reduced.

Figure 15:
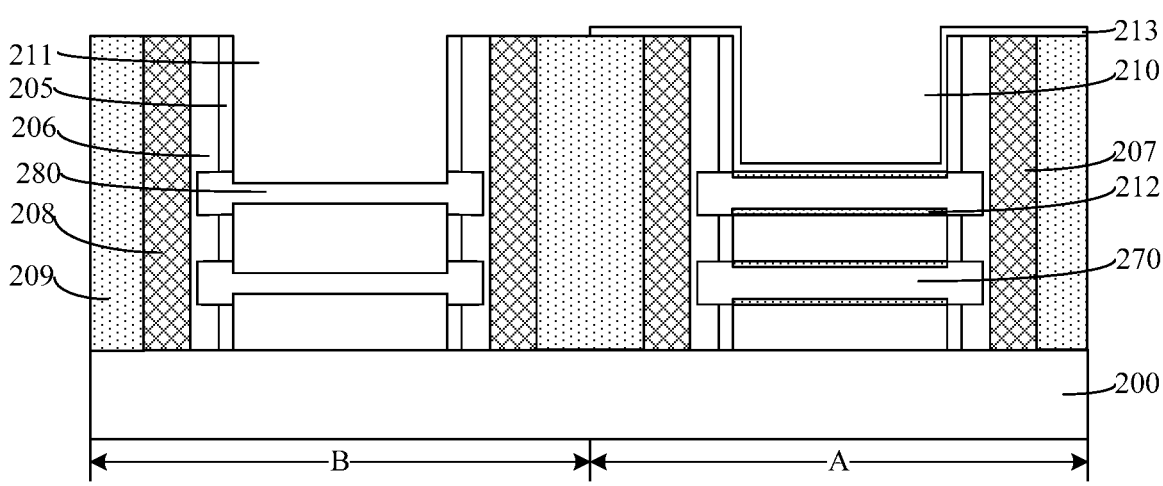

Further, as shown in FIG. 15, after forming the second nanowires 280, the second oxide layer 214 may be removed. The second oxide layer 214 may be removed by a wet etching process, a dry etching process, or a combination of a dry etching process and a wet etching process, etc.

Figure 16:
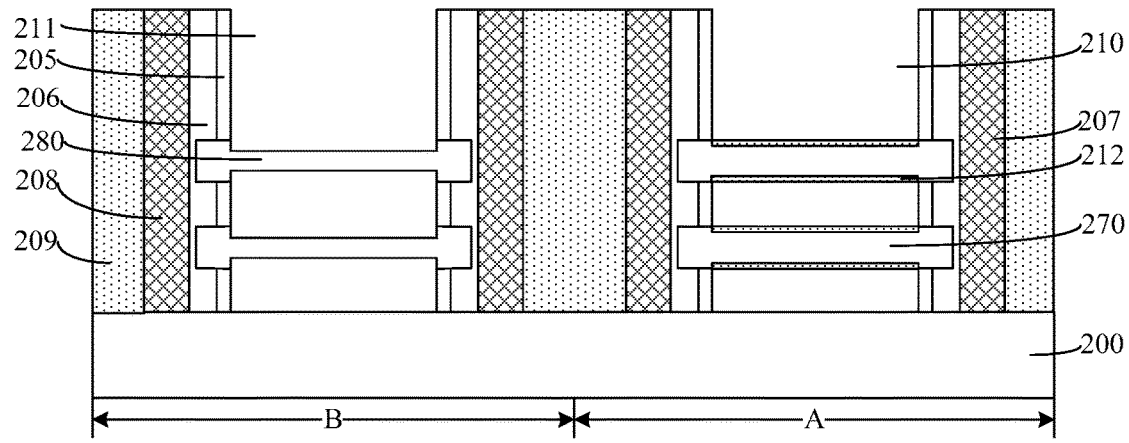

Further, as shown in FIG. 16, after removing the second oxide layer 214, the protective layer 213 may be removed. The protective layer 213 may be removed by a wet etching process, a dry etching process, or a combination of a dry etching process and a wet etching process, etc.

Figure 17:
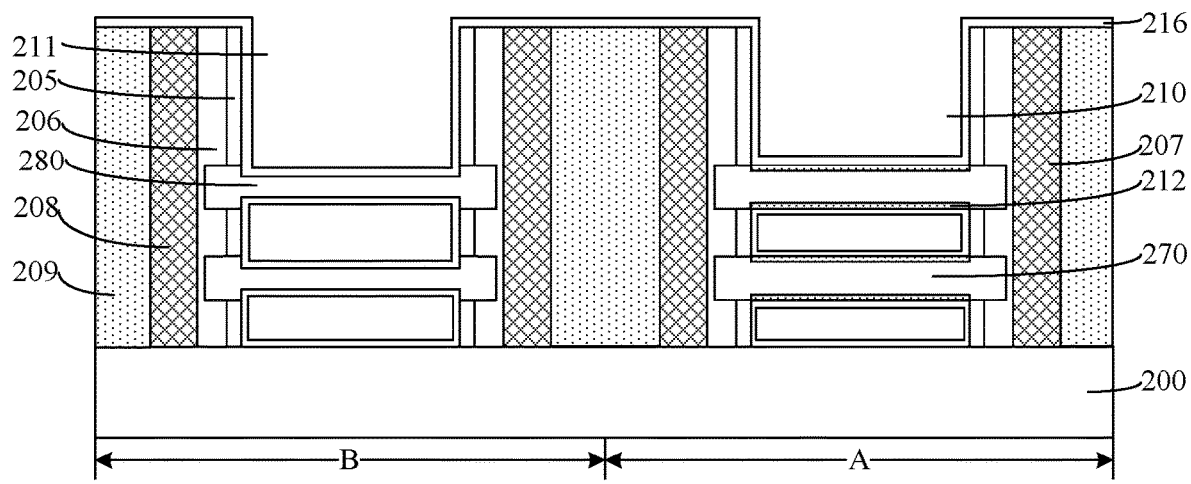

Returning to FIG. 20, after removing the protective layer, a gate dielectric layer may be formed (S109). FIG. 17 illustrates a corresponding semiconductor structure.

As shown in FIG. 17, a gate dielectric layer 216 is formed around the second nanowires 280 and the first oxide layer 212 in the first region A.

The gate dielectric layer 216 may be made of any appropriate material, such as a high-K dielectric material, etc. In one embodiment, the dielectric layer 216 is made of $HfO_2$. In some embodiments, the gate dielectric layer may be made of $La_2O_3$, HfSiON, $HfAlO_2$, $ZrO_2$, $Al_2O_3$, or $HfSiO_4$, etc.

Various processes may be used to form the gate dielectric layer 216, such as a CVD process, or a PVD process, etc.

Figure 18:
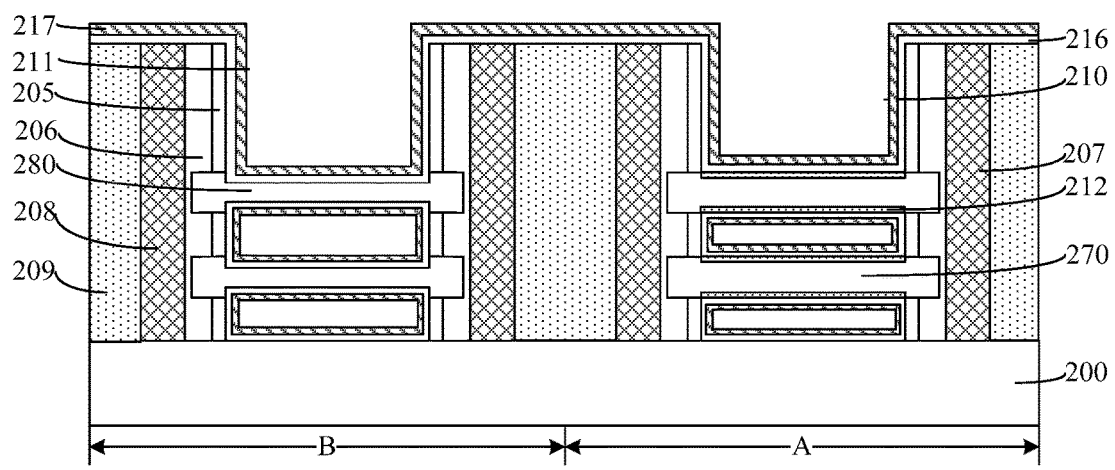

After forming the gate dielectric layer 216, as shown in FIG. 18, a stress layer 217 may be formed around the gate dielectric layer 216.

In one embodiment, the first region A and the second region B may be both used to form PMOS transistors, the stress layer 217 may be made of silicon nitride, or silicon germanium, etc. The gate dielectric layer 216 may be substantially thin, the stress layer 217 may generate a stress to the channel regions through the gate dielectric layer 216. Thus, the carrier mobility of the channel regions may be increased.

The stress layer 217 may be made of any appropriate material, such as silicon nitride, or silicon germanium, etc. The thickness of the stress layer 217 may be in range of approximately 4 nm-6 nm.

Returning to FIG. 20, after forming the stress layer, a first gate layer and a second gate layer may be formed (S110). FIG. 19 illustrates a corresponding semiconductor structure.

As shown in FIG. 19, after forming the stress layer 217, a first gate layer 218 may be formed in the first dummy gate opening 210 (referring to FIG. 18); and a second gate layer 219 may be formed in the second dummy gate opening 211 (referring to FIG. 18).

In one embodiment, the first gate layer 218 and the second gate layer 219 may be formed simultaneously. In some embodiments, the first gate layer may be formed after forming the second gate layer. In other embodiments, the second gate layer may be formed after forming the first gate layer.

In one embodiment, the process for forming the first gate layer 218 and the second gate layer 219 may include forming a gate material layer in the first dummy gate opening 210 and the second dummy gate opening 211, and on the surface of the stress layer 217, and planarizing the gate material layer until the top surface of the dielectric layer 209 is exposed to form the first gate layer 218 in the first dummy gate opening 210 and the second gate layer 218 in the second dummy gate opening 211.

In one embodiment, the gate material layer is made of Al. In some embodiments, the gate material layer may be made of Cu, Ag, Au, Ni, Ti, W, WN, or WSi, etc.

Various processes may be used to form the gate material layer, such as a CVD process, or PVD process, etc. The gate material layer may be planarized by any appropriate process, such as a chemical vapor deposition process, etc.

The present disclosure also provides a semiconductor structure. FIG. 19 illustrates a corresponding semiconductor structure.

As shown in FIG. 19, the semiconductor structure may include a semiconductor substrate 200 having a first region A and a second region B; and first nanowires 280 formed over the surface of the first region A of the semiconductor substrate 200 and second nanowires 270 formed over the surface of the second region B of the semiconductor substrate 200. The diameter of the first nanowires 270 may be greater than the diameter of the second nanowires 280. The semiconductor structure may also includes a first gate layer 218 formed around the first nanowires 270 and a second gate layer 219 formed around the second nanowires 280. The detailed structures and intermediate structures are described above with respect to the fabrication processes.

The first region A may be used to form peripheral devices of the semiconductor structure. The second region B may be used to form the core devices of the semiconductor structure. The voltage of the peripheral devices may be greater than the voltage of the core devices.

The diameter of the first nanowires 270 may be in a range of approximately 5.5 nm-8 nm. The diameter of the second nanowires 280 may be in a range of approximately 4.5 nm-7 nm.

When the first region A is used to form PMOS transistors, the semiconductor structure may also include the stress layer 217 around the first nanowires 270. The stress layer 217 may be between the first nanowires 270 and the first gate layer 218.

When the second region B is used to form PMOS transistors, the semiconductor structure may also include a stress layer 217 around the second nanowires 280. The stress layer 217 may be between the second nanowires 280 and the second gate layer 219.

The stress layer 217 may be made of silicon nitride, or silicon germanium, etc. The thickness of the stress layer 217 may be in range of approximately 4 nm-6 nm.

In the disclosed method for fabricating a semiconductor structure, the first region may be used to subsequently form peripheral devices. The second region may be used to subsequently form core devices. The voltage of the core devices may be substantially small, and the core devices may not be easy to accumulate heat. Thus, the self-heating effect of the core devices may not be obvious; and the focus of the core devices may be the body effect. Because the diameter of the second nanowires are substantially small, the depletion regions may be entirely depleted. Thus, the body effect of the core devices may be reduced; and the performance of the core devices may be improved.

The first region may be used to subsequently form peripheral devices. Comparing with the occupying area of the core devices, the occupying area of the peripheral devices may be substantially small. Thus, the body effect of the peripheral devices may not be obvious, and the main focus of the peripheral devices may be the self-heating effect. Although the voltage on the core devices may be substantially large, because the diameter of the first nanowires may be substantially large, the first nanowires may not be easy to accumulate heat. Thus, the self-heating effect of the peripheral devices may be reduced.

Further, when the first region is used to form PMOS transistors, after forming the first nanowires and before forming the first gate layer, a stress layer may be formed around the first nanowires. The stress layer may be able to apply a stress on the channel regions. Thus, the carrier mobility of the channel regions may be increased; and the performance of the devices in the first region may be improved.

Further, when the second region is used to form PMOS transistors, after forming the second nanowires and before forming the second gate layer, a stress layer may be formed around the second nanowires. The stress layer may be able to apply a stress on the channel regions. Thus, the carrier mobility of the channel regions may be increased; and the performance of the devices in the second regions may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   a semiconductor substrate having a first region and a second region, the first region being used to form peripheral devices, the second region being used to form core devices, and a voltage of the peripheral devices being greater than a voltage of the core devices;
   first nanowires formed over the first region of the semiconductor substrate;
   second nanowires with a diameter smaller than a diameter of the first nanowires formed over the second region of the semiconductor substrate;
   a first gate layer formed around the first nanowires; and
   a second gate layer formed around the second nanowires.

2. The semiconductor structure according to claim 1, wherein:
   the diameter of the first nanowires is in a range of approximately 5.5 nm-8 nm.

3. The semiconductor structure according to claim 1, wherein:
   the diameter of the second nanowires is in a range of approximately 4.5 nm-7 nm.

4. The semiconductor structure according to claim 1, wherein when the first region is used to form PMOS devices, further comprising:
   a stress layer formed around the first nanowires and between the first nanowires and the first gate layer.

5. The semiconductor structure according to claim 1, wherein when the second region is used to form PMOS devices, further comprising:
   a stress layer formed around the second nanowires and between the second nanowires and the second gate layer.

6. The semiconductor structure according to claim 5, wherein:
   the stress layer is made of one of silicon nitride and silicon germanium.

7. The semiconductor structure according to claim 1, wherein:
   the first nanowires and the second nanowires are made silicon.

8. The semiconductor structure according to claim 1, wherein:
   the gate layer is made of one of Al, Cu, Ag, Au, Ni, TI, W, WN and WSi.

9. A semiconductor structure, comprising:
   a semiconductor substrate having a first region and a second region, the first region being used to form PMOS devices;
   first nanowires formed over the first region of the semiconductor substrate;
   second nanowires with a diameter smaller than a diameter of the first nanowires formed over the second region of the semiconductor substrate;
   a first gate layer formed around the first nanowires;
   a second gate layer formed around the second nanowires; and
   a stress layer formed around the first nanowires and between the first nanowires and the first gate layer.

10. A semiconductor structure, comprising:
    a semiconductor substrate having a first region and a second region, the second region being used to form PMOS devices;
    first nanowires formed over the first region of the semiconductor substrate;
    second nanowires with a diameter smaller than a diameter of the first nanowires formed over the second region of the semiconductor substrate;
    a first gate layer formed around the first nanowires;
    a second gate layer formed around the second nanowires; and
    a stress layer formed around the second nanowires and between the second nanowires and the second gate layer.

* * * * *